United States Patent [19]

Lewis et al.

[11] Patent Number: 4,710,449

[45] Date of Patent: * Dec. 1, 1987

[54] HIGH CONTRAST LOW METAL ION POSITIVE PHOTORESIST DEVELOPING METHOD USING AQUEOUS BASE SOLUTIONS WITH SURFACTANTS

[75] Inventors: James M. Lewis, Williamsville, N.Y.; Andrew J. Blakeney, Seekonk, Mass.

[73] Assignee: Petrarch Systems, Inc., Bristol, Pa.

[ * ] Notice: The portion of the term of this patent subsequent to Sep. 23, 2003 has been disclaimed.

[21] Appl. No.: 823,892

[22] Filed: Jan. 29, 1986

[51] Int. Cl.[4] .................... G03F 7/26; G03C 5/00
[52] U.S. Cl. .................... 430/326; 430/149; 430/189; 430/296; 430/331
[58] Field of Search ............... 430/296, 326, 331, 189, 430/149

[56] References Cited

U.S. PATENT DOCUMENTS

| | | | |
|---|---|---|---|
| 3,891,439 | 6/1975 | Katz et al. | 430/331 |
| 3,961,100 | 6/1976 | Harris et al. | 430/296 |
| 3,961,101 | 6/1976 | Barton | 430/296 |
| 4,212,935 | 7/1980 | Conavello et al. | 430/326 |
| 4,307,178 | 12/1981 | Kaplan et al. | 430/326 |
| 4,359,520 | 11/1982 | Carothers et al. | 430/326 |
| 4,411,981 | 10/1983 | Minezaki | 430/299 |
| 4,606,999 | 8/1986 | Poulin et al. | 430/331 |

FOREIGN PATENT DOCUMENTS 62733 10/1982 European Pat. Off. ............ 430/331

OTHER PUBLICATIONS

Gauss, G. et al., IBM Technical Disclosure Bulletin, vol. 27, No. 1A, 6/1984, pp. 377–378.

*Primary Examiner*—Charles L. Bowers, Jr.
*Attorney, Agent, or Firm*—Felfe & Lynch

[57] ABSTRACT

A novel low metal ion developer composition used in a two step process which provided high contrast images and long developer bath life is provided. The process gives high contrast images. The substrate coated with positive photoresist is exposed then immersed in a "predip" bath, rinsed, and then, immersed in the developer bath, rinsed and dried. This process provided high contrast which does not decrease over the life of the developer system. The system consists of (1) a predip solution containing aqueous non-metal ion organic base and a cationic surfactant adjusted to a concentration that does not give development, and (2) a developer solution containing an aqueous solution of an non-metal ion organic base and a fluorochemical surfactant adjusted to a concentration that provides development. The high contrast is achieved by the cationic surfactant coating the resist and inhibiting the attack on the unexposed resist by the developer while permitting the developer to dissolve away the exposed resist.

30 Claims, No Drawings

HIGH CONTRAST LOW METAL ION POSITIVE PHOTORESIST DEVELOPING METHOD USING AQUEOUS BASE SOLUTIONS WITH SURFACTANTS

BACKGROUND OF THE INVENTION

1. Field of the Invention

This invention relates to a novel method for developing positive photoresists, and more particularly to a process for developing alkali soluble resin/diazoketone photoresists so as to increase the developing rate difference, termed contrast, between the exposed and unexposed resist. The invention resides in the discovery that when a photoresist film is contacted with a aqueous solution of an organic base and a cationic surfactant prior to development in a aqueous solution of an organic base and a fluorochemical surfactant, the developing rate of the unexposed resist is virtually zero resulting in very high contrast. Futhermore the exposed photoresist develops cleanly to the substrate and the patterns have vertical edge profiles.

2. Description of the Prior Art

Photoresists are typically films which change their solubility response to a developer solution after exposure to an irradiation source, such as ultraviolet light. As a consequence of the exposure, a different dissolution rate in the developer exists between the exposed and unexposed (masked over) portions of the photoresist film thus producing the mask pattern in the photoresist film after development. Those photoresists which become more soluble in the exposed regions are referred to as positive photoresists and are the type addressed in this invention.

Positive photoresists typically consist of an aqueous alkaline soluble resin, such as novolac resin or poly-(p-hydroxystyrene), and a diazonaphthoquinone sulfonic acid ester dissolved in an organic solvent. The resist is usually applied by a spin casting technique to silicon wafers which may have a thin coating of silicon dioxide, aluminum, silicon nitride, glass or other material typically used in the fabrication of integrated circuits.

The coated wafers are exposed to light through a mask which provides a pattern for building the various circuit components on the wafer. The pattern is developed by dipping, spraying or placing a puddle of developer solution on the wafer.

The developer used is usually an aqueous base solution of either inorganic bases such as KOH, NaOH and $Na_2SiO_3$ or organic bases such as tetramethylammonium hydroxide and (2-hydroxyethyl)trimethylammonium hydroxide. The inorganic, metal ion containing bases are not preferred for integrated circuit patterning due to possible mobile ion contamination of the devices.

Typically, the alteration of the solubility of the photoresist in the developer is only a relative change; consequently, even the unexposed portions of the photoresist dissolve to some extent. Any process that enhances the developing rate difference between the relatively soluble exposed and relatively insoluble unexposed photoresist film is advantageous. It is highly desirable that during development there be as little attack as possible on the unexposed resist under conditions which lead to complete removal of exposed resist down to the substrate. The lower the dissolution rate of the unexposed resist relative to the exposed resist, the higher the contrast. High contrast gives a pattern with well defined vertical side walls and little change in the pattern over irregular surface topography.

Fluorocarbon and organic acid surfactants have been used with inorganic developers to achieve high contrast as disclosed in U.S. patent application Nos. 06/505,571 and 06/660,600, respectively. Likewise, quaternary ammonium surfactants have been used with organic base developers. However, in both cases the surfactant is quickly depleted, typically after just a single dip in the developer bath, thus losing high contrast imparted by the surfactant and making the process difficult to control. In addition, the organic base developer with the quanternary ammonium surfactant does not clean the residue from the exposed areas reliably.

Another developing method, disclosed in U.S. Pat. No. 3,961,100, uses a double develop process without surfactants to improve the sensitivity and reduce the film loss resulting in higher contrast. This represents only a marginal improvement compared to the contrast achieved with this invention.

Another method, disclosed in U.S. Pat. No. 4,212,935 employes an organic solvent soak to reduce the attack of the developer on the unexposed resist film. This treatment removes the lower molecular weight resin from the film and thus lowers the developing rate of the surface of resist. In the exposed areas the developing rate of the surface is still sufficient for the developer to break through to the underlying untreated resist. The result of such treatment is an undercut profile and little attack on the unexposed resist. The process is lengthy and difficult to control as disclosed in IBM Technical Bulletin, Vol. 27, No. 1A, pp. 377-378 (June, 1984). The solvents, particularly chlorobenzene, are hazardous to handle.

Other techniques have been disclosed for chemically treating the coated photoresist for generating the undercut profile for metal lift-off processes. Various such techniques are disclosed in U.S. Pat. No. 4,212,935, but do not address the method and compositions disclosed in this invention in order to achieve high contrast, no unexposed film loss and the other benefits of the process to be disclosed in this invention.

A need exists for an organic base, aqueous developer which is capable of providing a high contrast value (gamma) of at least five (5) without sacrificing sensitivity and which attains the foregoing advantages and minimizes the stated drawbacks.

CROSS-REFERENCE TO RELATED APPLICATIONS

References made to copending U.S. patent applications, Ser. No. 767,318, filed on Aug. 19, 1985, which is a Divisional Application of Ser. No. 505,571, filed on June 17, 1983 (now abandoned) and which relates to a process of developing radiation sensitive positive resist films using a fluorocarbon surfactant containing developer solution and to U.S. patent application Ser. No. 660,600, filed on Oct. 5, 1984, which relates to a process of developing radiation sensitive positive resist films using certain carboxylated surfactants.

SUMMARY OF THE INVENTION

In accordance with the invention, it has been discovered that first contacting an exposed photoresist film with an aqueous solution consisting of an organic base and a cationic surfactant followed by a water rinse then contacting the photoresist film with an aqueous developer solution containing an organic base and a fluorocarbon surfactant gives very high contrast and clean patterns with vertical or, sometimes, undercut profiles.

This first or predip solution is neither sufficiently concentrated nor are the contact conditions sufficient to develop the photoresist. The developer solution, however, is sufficiently effective to develop the exposed photoresist in a a time period of from a few seconds to a few minutes depending on the desired process.

The quaternary ammonium surfactant complexes with the resin to form a developer resistant layer. This barrier layer prevents the developer from attacking the unexposed resist while not sufficient to inhibit the attack of the developer on the exposed resist. Since the quaternary ammonium surfactant is in a predip bath, it is not depleted by complexing with the dissolved resin from the developing bath. The fluorocarbon surfactant in the developer bath aids the developing by making the developer more aggressive without increasing the base strength or concentration, thus the developer is able to clean out the patterns and eliminate the residue with no significant loss of sensitivity.

The photoresists employed with the developing process of the present invention are positive acting, i.e., those in which the exposed portions of the composition become more soluble upon exposure.

Suitable sensitizers used in positive photoresists of this kind are diazo ketones having diazo and keto groups at adjacent positions on the molecule, such as the quinone-diazide sulfonic acid derivatives. Suitable alkali soluble resins must be employed in the photoresists. Those contemplated by this invention are the prepolymerized phenolic-aldehyde resins, e.g., phenol formaldehyde, which are known as novolacs and are available commercially. Resins of this kind are disclosed, for example, in U.S. Pat. Nos. 3,201,239; 3,868,254; 4,123,219 and 4,173,470, the disclosures of which are incorporated herein by reference. These phenolic-aldehyde resinous compounds must be soluble in organic solvents and aqueous alkaline solutions.

The predip bath consists of a aqueous solution of an organic base and a cationic surfactant. Bases that can be used belong to the general class of water soluble organic bases. Examples from the class are tetramethylammonium hydroxide, (2-hydroxyethyl)trimethylammonium hydroxide and tetra-(2-hydroxyethyl)ammonium hydroxide. This list is illustrative of the type of bases that can be used in the predip bath but should not be construed as being definitive.

The concentrations of base in the predip bath should be sufficiently low that there is no significant dissolution of the photoresist films resulting in measurable film loss in the exposed portion of the resist film. Since photoresists vary in the ease with which they dissolve in aqueous base solutions, it will be necessary to adjust the base concentration to the solubility characteristics of the resist. The concentration of base in the predip solution may range from 0.1% to 100% of the concentration of base in the developer. The preferred range is between 25 to 75% of the base strength in the developer. The most preferred range is about 50% of the base strength in the developer.

Following the predip treatment the photoresist film is rinsed then contacted with the developer. The base used in preparing the developer formulation may be selected from the general class of water soluble organic bases. Tetramethylammonium hydroxide, (2-hydroxyethyl)trimethylammonium hydroxide, tetra-(2-hydroxyethyl)ammonium hydroxide are illustrative of the types of bases that can be used in the developer but should not be considered definitive. Since photoresists vary in the ease with which they dissolve in aqueous base solutions, it will be necessary to adjust the base concentration to the solubility characteristics of the resist Following the process and using the compositions of the solutions of this invention imparts high contrast (gamma greater than 5) to positive photoresists of the diazonaphthoquinone photoactive compound/novolac resin type photoresists with no unexposed photoresist film loss and no significant loss of sensitivity. The patterns produced by this process have vertical edge profiles and there is no residual resist on the substrate in the areas where the exposed resist was developed away.

DESCRIPTION OF THE PREFERRED EMBODIMENT

The invention constitutes a process of contacting a positive acting photoresist with a predip solution, rinsing the substrate, developing, rinsing and drying in order to obtain high contrast resulting in vertical profiles, high resolution capabilities, no unexposed resist film loss and good sensitivity. The compositions of the predip solution and developer solutions are critical to achieving the performance.

The process is used with a diazonaphthoquinone-type photoactive compound and novolac resin based photoresist. Typically, the photoresist is spin coated from solution on a silicon substrate or other such substrates used in the manufacture of integrated circuits or photomasks. The resist is then dried by baking at about 100° C. for about 30 minutes in a convection oven; other baking processes, such as hot plate, will suffice. After the resist and substrate have cooled, the resist is irradiated by ultraviolet light or other actinic radiation to form a pattern of exposed and unexposed resist.

The resist coated substrate is then contacted with the predip solution for a time from 0.5 seconds to 30 minutes, more preferably from 10 seconds to 2 minutes, and most preferably one minute. The predip solution consists of, but is not limited to, an organic base and quaternary ammonium surfactant.

The base used in the predip solution may be selected from water soluble organic bases but more preferably from te trame thylammonium hydroxide, (2-hydroxyethyl)trimethylammonium hydroxide and tetra-(2-hydroxyethyl)ammonium hydroxide but most preferably tetramethylammonium hydroxide. The concentration of the base in the predip solution should be between 0.001 to 0.5 N or more preferably from 0.05 to 0.3 N.

The surfactants that can be used in the predip bath include compositions such as:

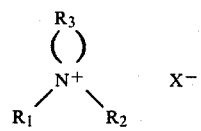

where $R_3$ is a cyclic group of from 2 to 6 carbons with from 0 to 3 heteroatoms chosen from the group o, N and S provided that each heteroatom is not bonded to another or a quaternary nitrogen. $R_1$ are saturated or unsaturated, straight or branched hydrocarbon chains of from 6 to 20 carbons. $R_2$ is the same as $R_1$ except has 1 to 120 carbon atoms. $X^-$ may be $Cl^-$, $I^-$, $Br^-$, $CH_3SO_4^-$ or $CH_3CH_2SO_4^-$. An example of a member of this class is Example A in Table I.

Other surfactants that can be used in the predip bath include compositions such as:

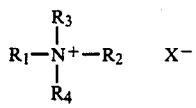

where $R_1$ and $R_2$ are as described above; $R_3$ is an alkyl group of between 1 and 4 carbons; and $R_4$ is a saturated or unsaturated straight or branched hydrocarbon chain of from 1 to 4 carbons, 1 to 4 quaternary ammonium groups of the formula:

wherein $R_5$ is a saturated or unsaturated straight or branched hydrocarbon chain of from 1 to 20 carbons, $R_6$ and $R_7$ are the same or different and each is an alkyl group of from 1 to 4 carbons, or phenalkyl wherein the alkyl moiety has from 0 to 3 carbons. Examples of members of this class are Example B and Example C in Table I.

Other surfactants that can be used in the predip bath include compositions such as:

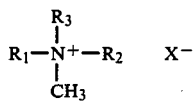

where $R_3$ is a hydrocarbon chain derived from coconut oils. $R_1$ and $R_2$ are hydroxy alkyl groups containing between 1 and 4 carbons. An example of this class of compound is Example D in Table I.

The concentration of cationic surfactant in the predip bath may be from 0.0001 to 1.0% by weight of the predip bath. The preferred concentration range is between 0.001 and 0.75% and the most preferred range is between 0.01 and 0.25%.

The substrate is then rinsed for a minimum period of time preferably greater than 10 seconds with deionized water and more preferably for one minute.

The substrate is then contacted with the developer solution until the resist that received proper exposure has dissolved cleanly away with no unexposed resist loss and more preferably for at least 10 seconds and most preferably more than 60 seconds.

The developer solution consists of, but is not limited to, an organic base and fluorocarbon surfactant. The base used in the developer solution may be selected from water soluble organic bases, and more preferably tetramethylammonium hydroxide, (2-hydroxyethyl)-trimethylammonium hydroxide and tetra-(2-hydroxyethyl)ammonium hydroxide, but most preferably tetramethylammonium hydroxide. Preferably, the base in the developer and in the predip are the same.

The surfactants that can be used in the developer bath are those characterized by formula:

where Y is a a radical selected from the group $—CH_2CH_2O—$, $—SO_2NR'—$, $—SO_3—$, $—SO_2N(R')CH_2CO_2—$, $—CO_2—$ and $—CO—NR'—$
wherein $R_f$ is either a straight or branched chain of the formula $C_pF_{2p+1}$ where p is an integer from 3 to 17; and wherein R is hydrogen or an acyl or alkyl radical of 1 to 30 carbon atoms and m is an integer of 2 to 26 and preferably where m is an integer of 5 to 26, and R' is hydrogen or an alkyl radical of 1 to 6 carbon atoms. The surfactant in the developer may be selected from those mentioned above but more preferably from those in Table II and most preferably Example A from Table II.

The developer bath operates at a pH of at least 9 and preferably at a pH above about 10.5 and most preferably above a pH of 12. The concentration of the organic base in the developer must be varied dependining on the solubility characteristics of the photoresist and on the developing process in order to obtain the desired sensitivity without unexposed photoresist film loss. The concentrations of the base in the developer solution should be between 0.05 to 1N or more preferably from 0.1 to 0.5 N.

The concentration of fluorocarbon surfactant in the developer may be in the range from 0.001 to 5% by weight of the total developer solution. The preferred range is 0.005 to 2%.

The following examples are illustrative of the invention. The enumeration of details in the examples should not be interpreted as a limitation on the invention except as may be expressed in the appended claims.

PREPARATION OF THE PHOTORESIST FOR DEVELOPING

The wafers were coated, prebaked and exposed in a conventional manner. The following is provided as typical.

The photoresist coating was prepared by spin coating the resist solution on a silicon wafer substrate. The silicon wafer had been subjected to a 200° C. dehydration bake for sixteen (16) hours; and then treated with a 50% hexamethyldisilazane solution in xylene for twenty seconds immediately prior to applying the photoresist for coating. The wafers were spun so as to provide a 1 micrometer (μm) thick film. The coated wafers were baked at 100° C. for 30 minutes in a forced air convection oven. After baking, the wafers were exposed to ultraviolet light through step tablet resolution mask with windows of various optical density so as to provide various exposure levels on the same wafer. The incident exposure was a range of exposure from no exposure to sufficient exposure for the resist to develop to the substrate. The contrast was determined from the slope of a line drawn parallel to the descending portion of a plot of the normalized film thickness remaining after developing vs. the common logarithm of the exposure.

DEVELOPING THE PHOTORESIST

The resist films in the following examples were prepared for developing as described above.

EXAMPLE 1

(Comparative)

The photoresist was contacted with a 0.378N tetramethylammonium hydroxide aqueous base solution containing 1% by weight of the total solution of the surfactant in Example A of Table II for 75 seconds at 25° C. The substrate was then rinsed in deionized water for 60 seconds and dried with nitrogen. The results are shown in Table III.

EXAMPLE 2

(Comparative)

The photoresist was contacted with deionized water for 60 seconds at 22° C. and then developed as described in Example 1. The results are shown in Table III.

EXAMPLE 3

(Comparative)

The photoresist was contacted with a 0.189 N tetramethylammonium hydroxide aqueous base solution for 30 seconds at 25° C. The substrate was rinsed with deionized water for 60 seconds, then developed in the developer as described in Example 1. The results are shown in Table III.

EXAMPLE 4

The photoresist was contacted with a 0.189 N tetramethylammonium hydroxide aqueous base solution containing 0.0025% by weight of the total solution of the surfactant in Example A of Table I for 30 seconds at 25° C. The substrate was rinsed with deionized water for 60 seconds, then developed in the developer as described in Example 1. The results are shown in Table III.

EXAMPLE 5

The photoresist was contacted with a 0.189 N tetramethylammonium hydroxide aqueous base solution containing 0.0015% by weight of the total solution of the surfactant in Example B of Table I for 30 seconds at 25° C. The substrate was rinsed with deionized water for 60 seconds, then developed in the developer as described in Example 1. The results are shown in Table III.

EXAMPLE 6

The photoresist was contacted with a 0.189 N tetramethylammonium hydroxide aqueous base solution containing 0.002% by weight of the total solution of the surfactant in Example C of Table I for 30 seconds at 25° C. The substrate was rinsed with deionized water for 60 seconds, then developed in the developer as described in Example 1. The results are shown in Table III

EXAMPLE 7

The photoresist was contacted with a 0.189 N tetramethylammonium hydroxide aqueous base solution containing 0.005% by weight of the total solution of the surfactant in Example D of Table I for 30 seconds at 25° C. The substrate was rinsed with deionized water for 60 seconds, then developed in the developer as described in Example 1. The results are shown in Table III.

TABLE I

| EXAMPLE | SURFACTANT |
|---|---|
| A | $C_6H_{13}$, $C_2H_5$ attached to $N^+$ with morpholine-type ring (two $CH_2-CH_2$ groups bridged by $O$), counterion $C_2H_5-SO_4^-$ |
| B | $C_{16}H_{31}-N^+(CH_3)_3$  $Cl^-$ |
| C | $Cl^-$ [$C_{14}H_{29}-N^+(CH_3)_2-(CH_2)-N^+(CH_3)_2-CH_3$] $Cl^-$ |
| D | $C_8H_{18}-N^+(CH_3)(CH_2CH_2OH)_2$  $Cl^-$ |

TABLE II

| Example | fluorosurfactant |
|---|---|
| A | $CF_3(CF_2)_6-CH_2CH_2O-(CH_2CH_2O)_4H$ |
| B | $CF_3(CF_2)_7-CO-N(CH_3)-(CH_2CH_2O)_{17}CH_3$ |
| C | $CF_3(CF_2)_7-SO_2-NH-(CH_2CH_2O)_{11}CH_3$ |
| D | $CF_3(CF_2)_8-SO_2-O-(CH_2CH_2O)_8-CH_3$ |
| E | $CF_3(CF_2)_7-CO_2-(CH_2CH_2O)_9-C_4H_9$ |
| F | $CF_3(CF_2)_7-SO_2-N(C_2H_5)-(CH_2CH_2O)_{15}CO-C_{14}H_{29}$ |
| G | $CF_3(CF_2)_8-SO_2-N(CH_3)-CH_2-CO_2-(CH_2CH_2O)_{10}C_{11}H_{23}$ |

TABLE III

| EXAMPLE | SENSITIVITY (mJ/cm²) | CONTRAST (gamma) | FILM LOSS (%) | WALL ANGLE (°) |
|---|---|---|---|---|
| 1 | 30 | 1.6 | 6 | 80 |
| 2 | 30 | 1.6 | 6 | 80 |
| 3 | 25 | 1.8 | 7 | 80 |
| 4 | 35 | 5.2 | 0 | 90 |
| 5 | 37 | 6 | 0 | 90 |
| 6 | 42 | 5 | 0 | 90 |
| 7 | 45 | 4.8 | 0 | 90 |

The invention has been particularly described with reference to preferred embodiments thereof; it will be understood by those skilled in the art, however, that changes in form and details may be made therein without departing from the spirit and scope of the invention.

What is claimed is:

1. A process for developing a positive radiation sensitive resist film comprised of radiation sensitive quinone diazide sulfonic acid derivatives in admixture with an alkali soluble resin that has been coated on a substrate and exposed to radiation in the form of a pattern to form soluble areas in the coating which are dissolved by the developer to form a surface relief pattern and which comprises:

(a) contacting the exposed film with a solution comprising an organic base aqueous solution adjusted to a concentration that does not give development of photoresist and containing a cationic surfactant from about 0.0001 to about 1.0% by weight of the total solution, to form a developer resistant layer
    (b) subjecting said film to an aqueous rinse, and
    (c) contacting the said film with an organic aqueous base developer solution having a pH of at least 9 or greater and containing from about 0.0001 to 5% based on the weight of developer of a fluorocarbon surfactant having the formula:

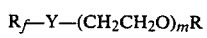

$$R_f-Y-(CH_2CH_2O)_mR$$

where Y is a radical selected from the group —CH$_2$CH$_2$O —, —SO$_2$NR—, —SO$_3$—, —SO$_2$N(R')CH$_2$CO$_2$—, —CO$_2$—and —CO—NR'— wherein R$_f$ is either a straight or branched chain of the formula C$_p$F$_{2p+1}$ where p is an integer of from 3-17 and wherein R is hydrogen or an acyl or alkyl radical of 1 to 30 carbon atoms and m is an integer of 2 to 26 and R' is hydrogen or an alkyl radical of 1-6 carbon atoms, until the exposed portions of the film are dissolved.

2. The process in claim 1 in which the organic base in Step (a) is tetramethylammonium hydroxide.

3. The process in claim 1 in which the organic base in Step (a) is (2-hydroxyethyl)trimethylamnonium hydroxide.

4. The process of claim 1 in which the cationic surfactant in Step (a) comprises a compound selected from those having the formula:

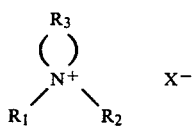

wherein R$_3$ is a cyclic group of from 2 to 6 carbons with from 0 to 3 heteroatoms chosen from the group o, N and S Provided that each heteroatom is not bonded to another or a quaternary nitrogen, R$_1$ is a saturated or unsaturated, straight or branched hydrocarbon chain of from 6 to 20 carbon atoms, R$_2$ is a saturated or unsaturated straight or branched hydrocarbon chain of 1 to 120 carbon atoms, X is Cl$^-$, I$^-$, Br$^-$, CH$_3$SO$_4^-$or CH$_3$CH$_2$SO$_4^-$.

5. The process of claim 4 in which the cationic surfactant in Step (a) comprises:

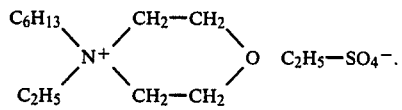

6. The process of claim 1 in which the cationic surfactant in Step (a) comprises a compound having the formula:

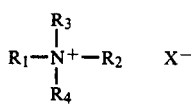

where R$_1$ is a saturated or unsaturated straight or branched hydrocarbon chain of 6 to 20 carbon atoms, R$_2$ is a saturated or unsaturated straight or branched hydrocarbon chain of 1 to 120 carbon atoms; R$_3$ is an alkyl of 1 to 4 carbon atoms; and R$_4$ is a saturated or unsaturated straight or branched hydrocarbon chain of from 1 to 4 carbon atoms or phenalkyl wherein the alkyl moiety has from 0 to 3 carbon atoms.

7. The process of claim 6 in which the cationic surfactant in Step (a) comprises:

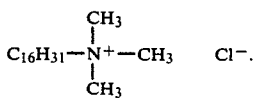

8. The process of claim 1 in which the cationic surfactant in Step (a) comprises a compound having the formula:

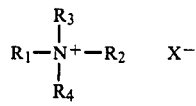

wherein R$_1$ is a saturated or unsaturated straight or branched hydrocarbon chain of 6 to 20 carbon atoms, R$_2$ is a saturated or unsaturated straight or branched hydrocarbon chain of 1 to 120 carbon atoms, R$_3$ is alkyl of 1 to 4 carbon atoms and R$_4$ is a saturated or unsaturated straight or branched hydrocarbon chain containing 1 to 4 quaternary ammonium groups having the formula —(N$^+$R$_5$R$_6$R$_7$) wherein R$_5$ is a saturated or unsaturated straight or branched hydrocarbon chain of from 1 to 20 carbon atoms, R$_6$ and R$_7$ are the same or different and each is an alkyl group of from 1 to 4 carbon atoms.

9. The process of claim 8 in which the cationic surfactant in Step (a) comprises:

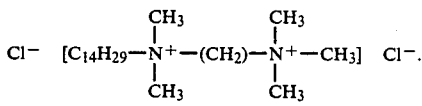

10. The process of claim 1 in which the cationic surfactant in Step (a) comprises a compound selected from those having the formula:

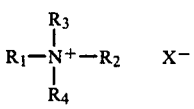

where R is a hydrocarbon chain derived from coconut oils R$_1$ and R$_2$ are hydroxy alkyl groups containing between 1 and 4 carbons.

11. The process of claim 10 in which the cationic surfactant in Step (a) comprises:

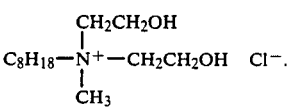

12. The process in claim 1 in which the surfactant in Step (c) is CF$_3$(CF$_2$)$_6$—CH$_2$CH$_2$O—(CH$_2$CH$_2$O)$_4$H.

13. The process in claim 1 in which the organic base in Step (c) is tetramethylammonium hydroxide.

14. The process in claim 1 in which the organic base in Step (c) is (2-hydroxyethyl)trimethylammonium hydroxide.

15. The process in claim 4 in which the organic base in Steps (a) and (c) is tetramethylammonium hydroxide and the surfactant in Step (c) is CF$_3$(CF$_2$)$_6$—CH$_2$CH$_2$O—(CH$_2$CH$_2$O)$_4$H.

16. The process in claim 5 in which the organic base in Steps (a) and (c) is tetramethylammonium hydroxide and the surfactant in Step (c) is CF$_3$(CF$_2$)$_6$—CH$_2$CH$_2$O—(CH$_2$CH$_2$O)$_4$H.

17. The process in claim 6 in which the organic base in Steps (a) and (c) is tetramethylammonium hydroxide and the surfactant in Step (c) is $CF_3(CF_2)_6$—$CH_2CH_2O$—$(CH_2CH_2O)_4H$.

18. The process in claim 7 in which the organic base in Steps (a) and (c) is tetramethylammonium hydroxide and the surfactant in Step (c) is $CF_3(CF_2)_6$—$CH_2CH_2O$—$(CH_2CH_2O)_4H$.

19. The process in claim 8 in which the organic base in Steps (a) and (c) is tetramethylammonium hydroxide and the surfactant in Step (c) is $CF_3(CF_2)_6$—$CH_2CH_2O$—$(CH_2CH_2O)_4H$.

20. The process in claim 9 in which the organic base in Steps (a) and (c) is tetramethylammonium hydroxide and the surfactant in Step (c) is $CF_3(CF_2)_6$—$CH_2CH_2O$—$(CH_2CH_2O)_4H$.

21. The process in claim 10 in which the organio base in steps (a) and (c) is tetramethylammonium hydroxide and the surfactant in Step (c) is $CF_3(CF_2)_6$—$CH_2CH_2O$—$(CH_2CH_2O)_4H$.

22. The process in claim 11 in which the organic base in Steps (a) and (c) is tetramethylammonium hydroxide and the surfactant in Step (c) is $CF_3(CF_2)_6$—$CH_2CH_2O$—$(CH_2CH_2O)_4H$.

23. The process in claim 4 in which the organic base in Steps (a) and (c) is (2-hydroxyethyl)trimethylammonium hydroxide and the surfactant in Step (c) is $CF_3(CF_2)_6$—$CH_2CH_2O$—$(CH_2CH_2O)_4H$.

24. The process in claim 5 in which the organic base in Steps (a) and (c) is (2-hydroxyethyl)trimethylammonium hydroxide and the surfactant in Step (c) is $CF_3(CF_2)_6$—$CH_2CH_2O$—$(CH_2CH_2O)_4H$.

25. The process in claim 6 in which the organic base in Steps (a) and (c) is (2-hydroxyethyl)trimethylammonium hydroxide and the surfactant in Step (c) is $CF_3(CF_2)_6$—$CH_2CH_2O$—$(CH_2CH_2O)_4H$.

26. The process in claim 7 in which the organic base in Steps (a) and (c) is (2-hydroxyethyl)trimethylammonium hydroxide and the surfactant in Step (c) is $CF_3(CF_2)_6$—$CH_2CH_2O$—$(CH_2CH_2O)_4H$.

27. The process in claim 8 in which the organic base in Steps (a) and (c) is (2-hydroxyethyl)trimethylammonium hydroxide and the surfactant in Step (c) is $CF_3(CF_2)_6$—$CH_2CH_2O$—$(CH_2CH_2O)_4H$.

28. The process in claim 9 in which the organic base in Steps (a) and (c) is (2-hydroxyethyl)trimethylammonium hydroxide and the surfactant in Step (c) is $CF_3(CF_2)_6$—$CH_2CH_2O$—$(CH_2CH_2O)_4H$.

29. The process in claim 10 in which the organic base in Steps (a) and (c) is (2-hydroxyethyl)trimethylammonium hydroxide and the surfactant in Step (c) is $CF_3(CF_2)_6$—$CH_2CH_2O$—$(CH_2CH_2O)_4H$.

30. The process in claim 11 in which the organic base in Steps (a) and (c) is (2-hydroxyethyl)trimethylammonium hydroxide and the surfactant in Step (c) is $CF_3(CF_2)_6$—$CH_2CH_2O$—$(CH_2CH_2O)_4H$.

* * * * *

UNITED STATES PATENT AND TRADEMARK OFFICE
CERTIFICATE OF CORRECTION

PATENT NO. : 4,710,449

DATED : December 1, 1987

INVENTOR(S) : James M. Lewis et al

It is certified that error appears in the above-identified patent and that said Letters Patent is hereby corrected as shown below:

Column 4, line 47 delete "te trame thylammonium" and insert therefor -- tetramethylammonium --;

Column 4, line 63 delete "o" and insert therefor -- O --;

Column 6, line 9 delete "dependining" and insert therefor -- depending --;

Column 9, line 27 delete "o" and insert therefor -- O --;

Column 11, line 15 delete "organio" and insert therefor -- organic --.

Signed and Sealed this

Twenty-ninth Day of November, 1988

Attest:

DONALD J. QUIGG

Attesting Officer

Commissioner of Patents and Trademarks

UNITED STATES PATENT AND TRADEMARK OFFICE
CERTIFICATE OF CORRECTION

PATENT NO. : 4,710,449
DATED : December 1, 1987
INVENTOR(S) : Lewis, J. M. and Blakeney, A. J.

It is certified that error appears in the above-identified patent and that said Letters Patent is hereby corrected as shown below:

Claim 8, column 10, line 7, delete "N-" and insert --N+--.

Claim 10, column 10, line 36 reading

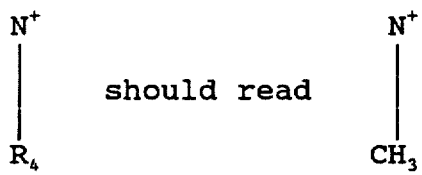

Claim 10, column 10, line 40, delete "R" and insert --$R_3$--.

Signed and Sealed this

Twenty-eighth Day of January, 1992

Attest:

HARRY F. MANBECK, JR.

Attesting Officer      Commissioner of Patents and Trademarks